United States Patent
Heffels et al.

(10) Patent No.: US 12,203,644 B2
(45) Date of Patent: Jan. 21, 2025

(54) ELECTRONIC DEVICE, LIGHT EMITTING DEVICE AND METHOD FOR MANUFACTURING AN ELECTRONIC DEVICE

(71) Applicant: LUMILEDS LLC, San Jose, CA (US)

(72) Inventors: Wilbert Heffels, Middelburg (NL); Harry Gijsbers, Heerlen (NL); Josef Andreas Schug, Würselen (DE)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 18/020,803

(22) PCT Filed: Aug. 13, 2021

(86) PCT No.: PCT/US2021/045909
§ 371 (c)(1),
(2) Date: Feb. 10, 2023

(87) PCT Pub. No.: WO2022/036194
PCT Pub. Date: Feb. 17, 2022

(65) Prior Publication Data
US 2023/0304655 A1    Sep. 28, 2023

Related U.S. Application Data

(60) Provisional application No. 63/065,295, filed on Aug. 13, 2020.

(51) Int. Cl.
| | | |
|---|---|---|
| *F21V 29/70* | (2015.01) |
| *F21V 19/00* | (2006.01) |
| *H01L 33/48* | (2010.01) |
| *H01L 33/62* | (2010.01) |
| *H01L 33/64* | (2010.01) |
| *F21Y 115/10* | (2016.01) |

(52) U.S. Cl.
CPC ............ *F21V 29/70* (2015.01); *F21V 19/005* (2013.01); *H01L 33/486* (2013.01); *H01L 33/62* (2013.01); *H01L 33/642* (2013.01); *F21Y 2115/10* (2016.08); *H01L 2933/0066* (2013.01); *H01L 2933/0075* (2013.01)

(58) Field of Classification Search
CPC ....... F21V 29/70; F21V 19/005; H01L 33/642
See application file for complete search history.

(56) References Cited

U.S. PATENT DOCUMENTS

2008/0023721 A1* 1/2008 Lee .................... H01L 33/56
257/E33.059
2011/0180819 A1    7/2011 Van Elmp et al.

FOREIGN PATENT DOCUMENTS

| CN | 106969277 A | 7/2017 |
|---|---|---|
| EP | 2388812 A2 | 11/2011 |

(Continued)

OTHER PUBLICATIONS

International Search Report and Written Opinion mailed Nov. 26, 2021 for PCT International Application No. PCT/US2021/045909.

*Primary Examiner* — Julie A Bannan
(74) *Attorney, Agent, or Firm* — Volpe Koenig (57) ABSTRACT

An electronic device includes a heat dissipation structure that includes one or more openings. An electronic component is disposed on a surface of the heat dissipation structure and over the one or more openings. The electronic component is coupled to the heat dissipation structure by an adhesion material in the one or more openings.

20 Claims, 7 Drawing Sheets

(56) References Cited

FOREIGN PATENT DOCUMENTS

| | | | | |
|---|---|---|---|---|
| JP | 2003060125 | A | * | 2/2003 |
| JP | 2004200533 | A | * | 7/2004 |
| KR | 101679832 | B1 | | 11/2016 |

* cited by examiner

ELECTRONIC DEVICE, LIGHT EMITTING DEVICE AND METHOD FOR MANUFACTURING AN ELECTRONIC DEVICE

CROSS REFERENCE TO RELATED APPLICATIONS

This application is a § 371 application of International Application No. PCT/US2021/045909, filed Aug. 13, 2021, which claims the benefit of U.S. Provisional Patent Application No. 63/065,295, which was filed on Aug. 13, 2020, the contents of which are hereby incorporated by reference herein.

BACKGROUND

Electronic components, such as light emitting diodes (LEDs), printed circuit boards (PCBs), processors, memory chips, or transistors, are usually mounted in thermal connection with heat dissipation structures, such as heat sinks and/or heat spreaders to dissipate heat generated upon operation. A reliable heat transport and a secure stable thermal connection between the electronic component and a corresponding heat dissipation structure depend on a reliable mechanical connection (direct or indirect) between the electronic component and the corresponding heat dissipation structure.

SUMMARY

An electronic device includes a heat dissipation structure that includes one or more openings. An electronic component is disposed on a surface of the heat dissipation structure and over the one or more openings. The electronic component is coupled to the heat dissipation structure by an adhesion material in the one or more openings.

BRIEF DESCRIPTION OF THE DRAWINGS

A more detailed understanding can be had from the following description, given by way of example in conjunction with the accompanying drawings wherein.

DETAILED DESCRIPTION

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Apart from reliability of the mechanical connection, electronic components may need to be positioned with high precision with respect to the heat dissipation structure, and it may be desirable that the precise positioning be guaranteed during the entire lifetime of the electronic device. While riveting may offer advantages in terms of fabrication speed, reduced fabrication complexity and reduced costs for mechanical fastening, deformation of rivets for fastening the electronic component to the heat dissipation structure may lead to overstressing of the electronic component (for example the PCB), which may in turn lead to loose, inaccurate and non-reliable mechanical connections.

Embodiments described herein may provide for an electronic device with a reliable and accurate mechanical connection between one or more electronic components and at least one corresponding heat dissipation structure. Embodiments described herein may further provide a high precision and reliable light emitting device. Embodiments described herein may also provide a method that allows to reliably and accurately mechanically fasten an electronic component to a corresponding heat sink.

Figure 1A:
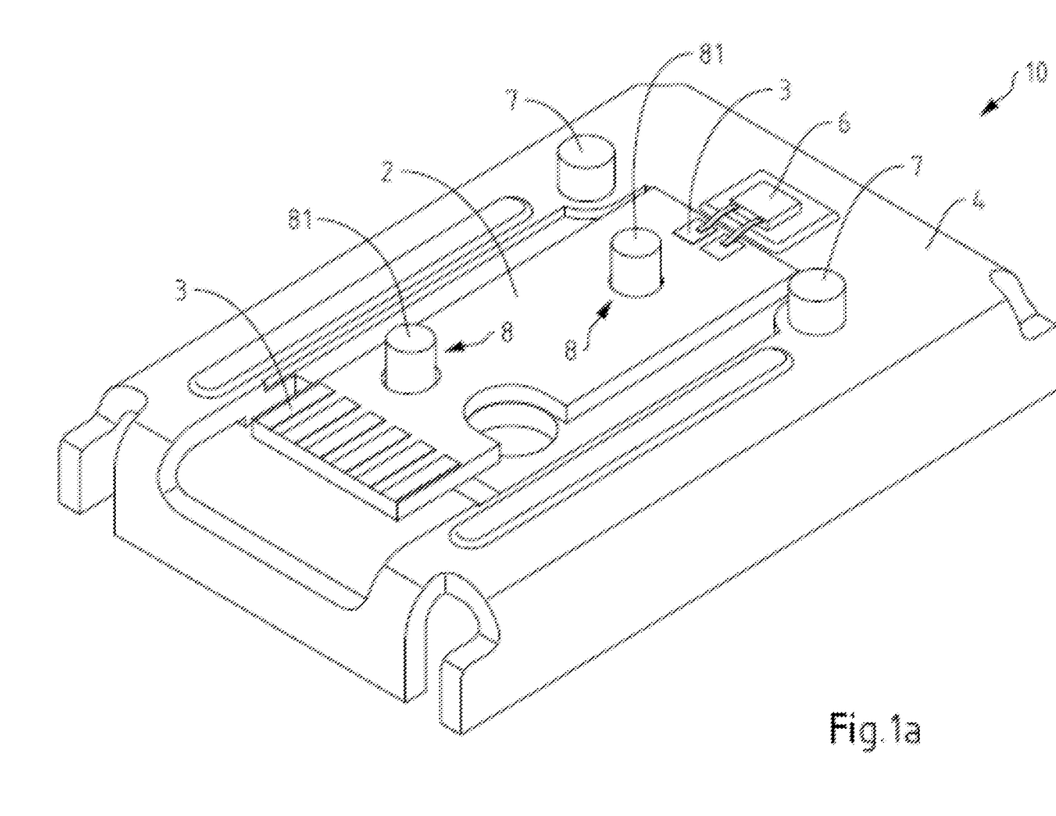
FIG. 1A is a schematic representation of an example electronic device with a heat dissipation structure and electronic components.

FIG. 1A is a schematic representation of an example electronic device 10 with a heat dissipation structure and electronic components. In the example illustrated in FIG. 1A, the heat dissipation structure is a heat sink 4 and the electronic components are in the form of a printed circuit board (PCB) 2 electrically coupled to a light emitting diode (LED) 6. The electronic device 10 may be a lighting device suitable, for example, as a light source for an automotive head or tail light. In some embodiments, a reflector (not shown in FIG. 1A) or other component of a head light or an LED bulb may be mounted to the electronic device 10, for example, using pins 7. The PCB 2 may be provided with electrical contacts 3 for providing power to the LED 6 and for signal transmission back to a corresponding controller.

PCB 2 and LED 6 may be thermally coupled to the heat sink 4 such that heat generated upon operation may be efficiently dissipated away. To this end, the heat sink 4 may be made of a thermally conductive sheet metal. The heat sink 4 may, for example, be formed from coated or anodized metallic materials. For example, the heat sink 4 may include aluminum, copper, and/or aluminum and/or copper based alloys, which may be coated or anodized in some embodiments. Two rivets 8 with respective end portions 81 may extend through corresponding openings (through holes in FIG. 1A) formed in PCB 2. In FIG. 1A, the end portions 81 are shown in a state before deformation.

Figure 1B:
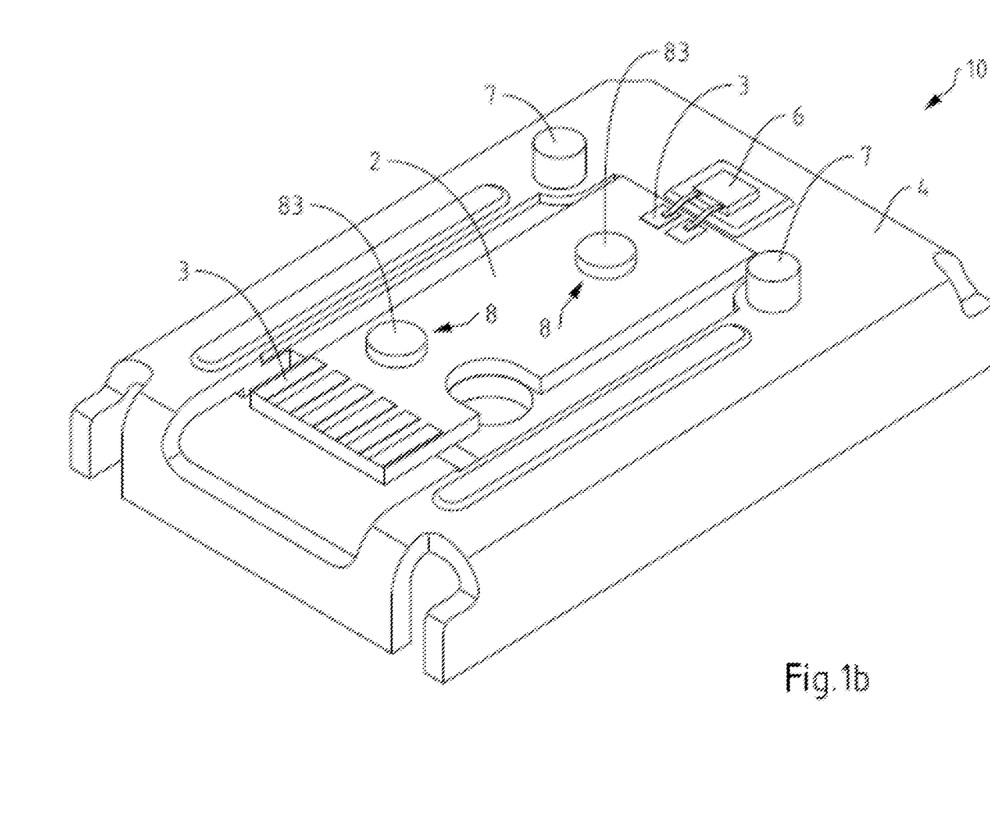
FIG. 1B is a schematic representation of the electronic device of FIG. 1A that shows fastening members used to fasten a PCB to the heat sink with the fastening members having deformed head portions.

FIG. 1B is a schematic representation of the electronic device of FIG. 1A that shows fastening members used to fasten a PCB to the heat sink with the fastening members having deformed head portions. In the example illustrated in FIG. 1B, the head portions 81 of FIG. 1A are deformed by, for example, punching into deformed head portions 83 of enlarged shape. As can be taken from the figure, the shown deformed head portions 83 may have a conventional mushroom shape that may not allow for a controlled and predefined force distribution and which, thus, may lead to drawbacks described above.

Figures 2A, 2B:
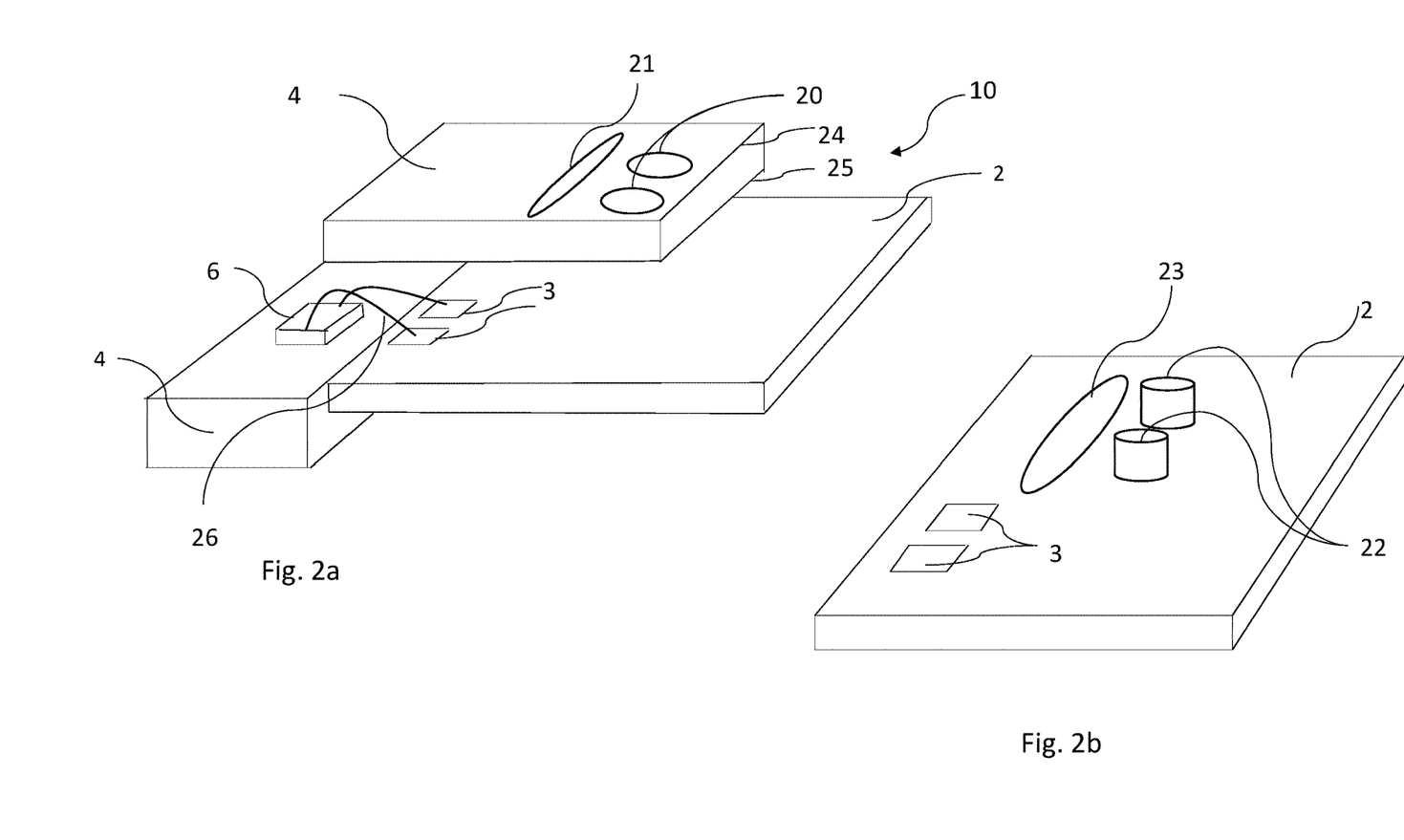
FIG. 2A is a schematic representation of another example electronic device.
FIG. 2B is a schematic representation of the electronic component of the electronic device of FIG. 2A.

FIG. 2A is a schematic representation of another example electronic device 10. In the example illustrated in FIG. 2A, the heat dissipation structure 4 may be non-planar and have at least a portion that is disposed over the electronic component 2 such that through holes 20, 21 formed in the heat dissipation structure 4 are positioned over the electronic component 2. The electronic component 2 is fixed to the heat dissipation structure 4 by adhesive in the through holes 20, 21. As shown in FIG. 2A, the through holes 20, 21 extend from a top surface 24 of the heat dissipation structure 4 to a bottom surface 25 of the heat dissipation structure 4, and the electronic component 2 is attached below a part of the heat dissipation structure 4 at the bottom surface 25. Adhesive may be provided in the through holes 20, 21 in contact with the electronic component 2. By curing the adhesive, the heat dissipation structure 4 and the electronic component 2 may be fixed together.

In some embodiments, the heat dissipation structure may be or include a heat sink and/or a heat spreader. A heat sink may correspond to a passive heat exchanger that transfers heat generated upon operation of electronic components, such as printed circuit boards (PCBs), light emitting diodes (LEDs), processors, memory chips, transistors, etc., to a gaseous or fluid medium, such as air or a liquid coolant, to thereby dissipate heat away from the electronic component. In some embodiments, the heat sink may be made from a thermally conductive material, such as a metallic material, for example from sheet metal. In some embodiments, the heat sink may be or include coated or anodized metallic materials. In some embodiments, the heat sink may be or include aluminum, copper, and/or aluminum and/or copper based alloys, which may be coated or anodized in embodiments.

A heat spreader may be a component configured to transfer heat energy from the electronic component to a heat sink and may, in some embodiments, be realized as a plate or block of material having a high thermal conductivity. In some embodiments, the heat spreader may be or include coated or anodized metallic materials. In some embodiments, the heat spreader may be or include aluminum, copper, and/or aluminum and/or copper based alloys, which may be coated or anodized in embodiments.

In some embodiments, the adhesive may be a type of adhesive that may be light cured, such as by UV curing, electron beam curing, heat curing, condensation curing or reaction curing, such as 2-component reaction curing. Such adhesives may be introduced in the through hole and then cured to form a stress-free, stable and reliable connection with high position accuracy. The adhesive in the hole may be accessible for curing, such as by UV light or an electron beam.

The through holes may have any suitable shape, such as round or longitudinal. For example, the through holes may be round and may be provided by simple drilling. After positioning the electronic device on the heat dissipation structure over the through holes, the through holes may become blind through holes for dispensing the adhesive. Within the scope of the embodiments described herein, the holes may have different shapes. For example, the holes may have a longitudinal shape in order to provide a larger contact surface, such as over a larger length, and may contribute to the stress free connection.

In embodiments, the electronic component may be or include a sensitive electronic component, such as a printed circuit board (PCB), one or more processors, one or more memory chips, or one or more transistors. In some embodiments, the electronic component may be or include one or more PCBs and/or one or more LEDs, such as one or more PCBs electrically connected to the one or more LEDs for controlling the one or more LEDs.

In some embodiments, the electronic component, such as a printed circuit board, may be electrically connected to at least one light emitting element, thermally connected with the heat dissipation structure. The light emitting device may be of particular advantage for applications involving light emitting elements, which may produce large amounts of heat upon operation, such as in vehicular exterior lighting applications, such as headlight or taillight applications.

The electronic component 2, which may be a printed circuit board (PCB) in some embodiments, may be provided with electric contacts 3. In order to provide a light emitting device, a light emitting diode (LED) 6 may be provided on a portion of the heat dissipation structure 4 and connected by wire bonds or ribbon bonds 26 to the electric contacts 3 on the electronic component 2. As a result, the heat dissipation path of the LED 6 may be decoupled from that of the electronic component 2 and only limited heat may be exchanged between the LED 6 and the electronic component 2. The heat generated by the light emitting element and by the electronic component may, thus, be mainly dissipated to the heat dissipation structure and not between the light emitting element and the electronic component.

Within the scope of the embodiments described herein, the PCB and the LEDs need not be in the same plane or in parallel. For certain applications, it may even be preferred that the PCB and one or more LEDs are not parallel but inclined or even perpendicular to each other.

According to some embodiments, the at least one light emitting element may be an LED and may, for example, be used in a headlight or taillight of a car or motorcycle. For high-intensity vehicular applications, for example, the light emitting device may allow for a particular advantageous connection of the LED and/or the PCB to the heat distribution structure, which may thus enable an enhanced and reliable heat transfer that can be maintained throughout the entire lifetime of the electronic device. In embodiments, the light emitting element and the electronic component, such as a PCB, may be positioned separately on the heat dissipation structure. This decoupling of the heat dissipation of the LED and the electronic component may contribute to an improved heat dissipation and result in a longer lifetime.

FIG. 2B is a schematic representation of the electronic component 2 of the electronic device 10 of FIG. 2A. Besides the contact pads 3, in some embodiments, the electronic component may also be provided with adhesion promotors 23, 22 in the contact areas for the through holes 20, 21. The contact area 23 for through hole 21 may be roughened to improve adhesion with the electronic component. The contact area for the through holes 20 may be provided with pins 22 that may extend into the through holes 20. The pins may increase the positioning accuracy of the electronic component with the heat dissipation structure and also provide a large contact surface for adhesion for a stronger connection.

Figure 2C:
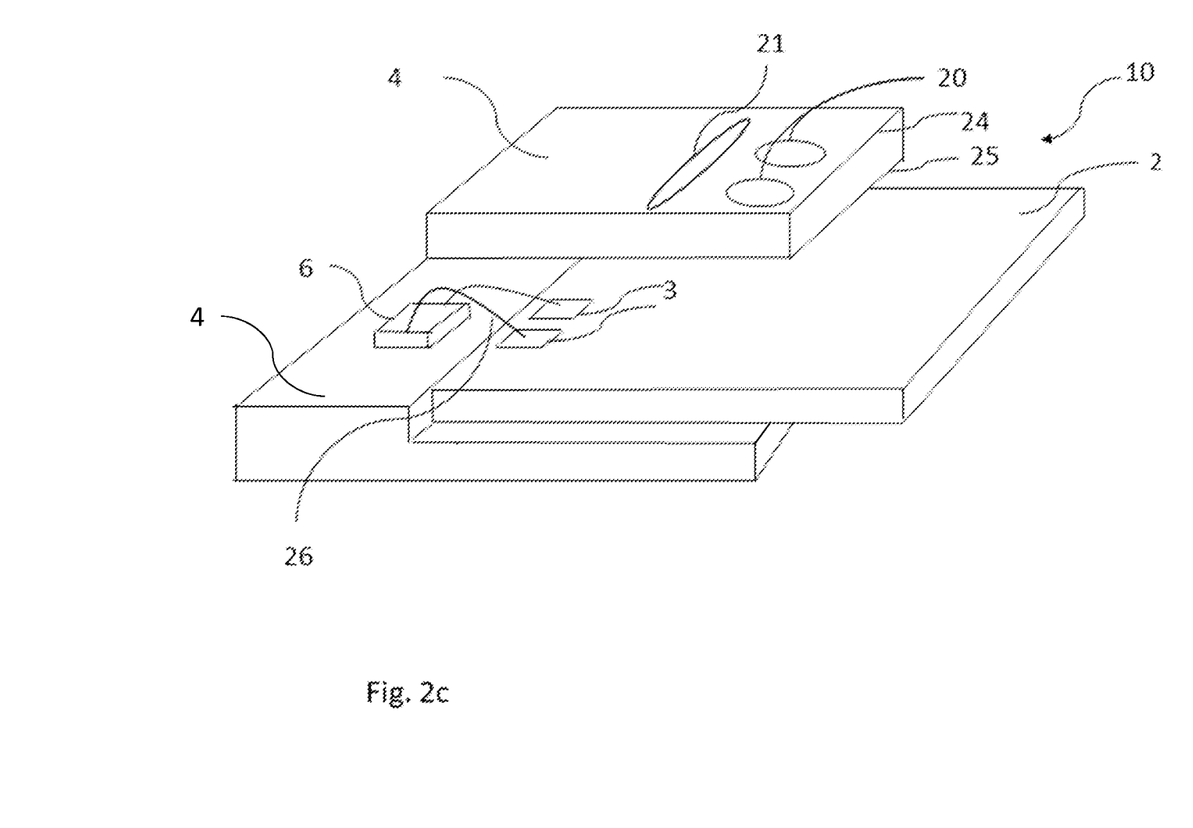
FIG. 2C is a diagram of another example electronic device.

FIG. 2C is a diagram of another example electronic device 10. The electronic device 10 of FIG. 2C is similar to the electronic device 10 of FIG. 2A, except that FIG. 2C shows that the heat sink 4 can take various shapes. In the example illustrated in FIG. 2C, the portion of the heat sink 4 on which the LED 6 is disposed has a portion that extends underneath the electronic component 2 to provide additional support and heat dissipation for the electronic device 2.

Figures 3A, 3B:
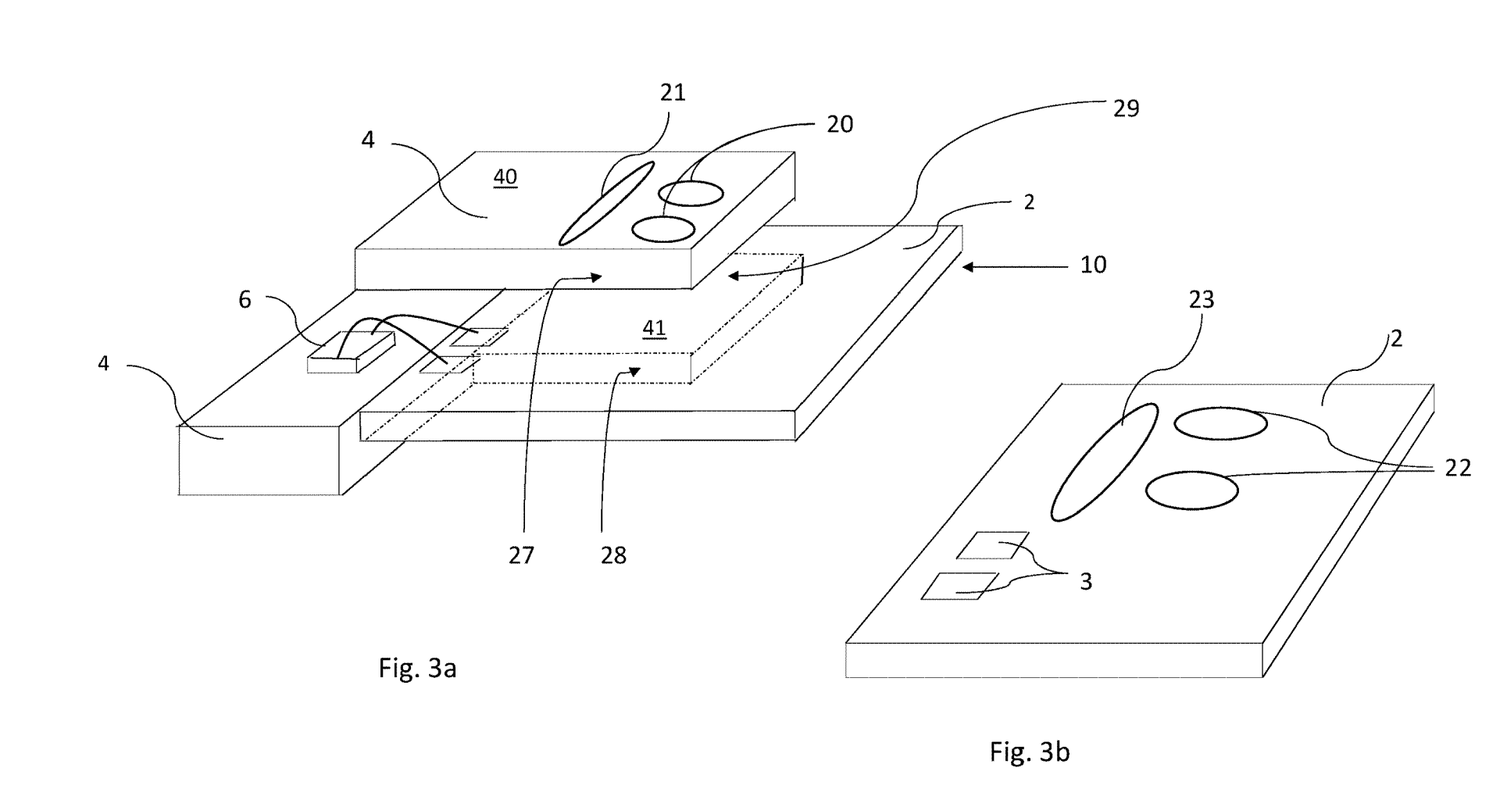
FIG. 3A is a schematic representation of another electronic device.
FIG. 3B is a schematic representation of the electronic component of the electronic device of FIG. 2A.

FIG. 3A is a schematic representation of another electronic device 10. In the example illustrated in FIG. 3A, the heat sink 4 includes at least an upper portion 40 and a lower portion 41 (shown in dashed lines in FIG. 3a). A slot 29 is provided between the walls 27 and 28 of the upper portion 40 and the lower portion 28, and the electronic component 2 may be positioned at least partly in the slot 29 over through holes 20, 21. The electronic component 2 may be fixed to the heat dissipation structure 4 by adhesive in the through holes 20, 21. This may contribute to accurate positioning and a reliable connection.

The through holes 20, 21 may be provided in one or both of the walls 27, 28. In order to provide a light emitting device, a light emitting diode (LED) 6 may be provided on the heat dissipation structure 4 and connected by one or more of wire bonds or ribbon bonds 26 to the electric contacts 3. As a result, the heat dissipation path of the LED 6 may be decoupled form that of the electronic component 2, and only limited heat may be exchanged between the LED 6 and the electronic component 2. Within the scope of the embodiments described herein, the PCB and the LEDs may not need to be in the same plane or parallel. For certain applications, it may even be preferred that the PCB and one or more LEDs are not parallel but inclined or even perpendicular to each other.

FIG. 3B is a schematic representation of the electronic component of the electronic device of FIG. 2A. The electronic component illustrated in FIG. 3B corresponds with the electronic component of FIG. 2B provided that no pins are used in order to be able to position the electronic component 2 in the slot 29 of the heat dissipation structure 4. Instead, the contact areas 22 may be roughened for optimal adhesion.

Figure 3C:
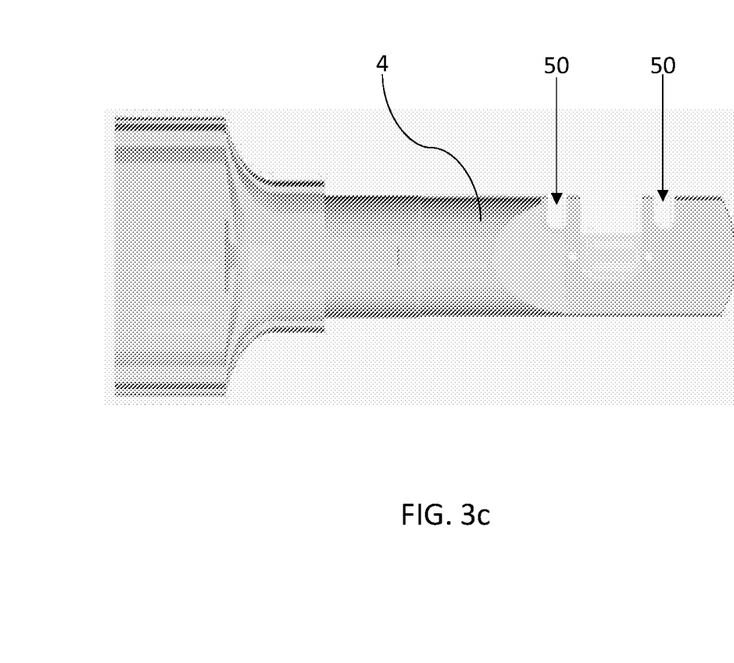
FIGS. 3C and 3D are perspective views of another example of an electronic device such as illustrated in FIG. 3A.
Figure 3D:
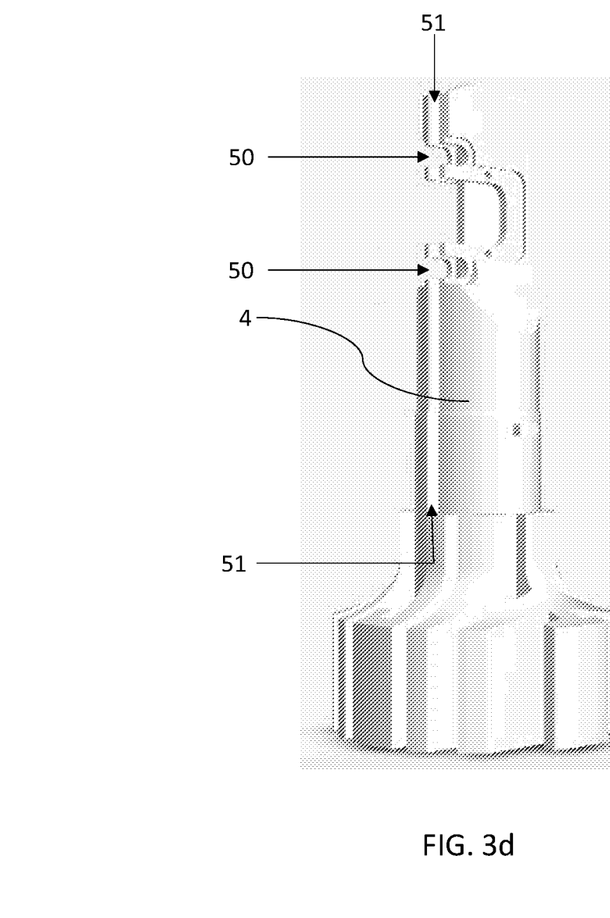

FIGS. 3C and 3D are perspective views of another example of an electronic device such as illustrated in FIG. 3A. In the examples illustrated in FIGS. 3C and 3D, a slot 51 is provided in the heat sink 4 in which the electronic component (not shown in FIGS. 3C and 3D) may be disposed. As compared to the example illustrated in FIG. 3A, rather than including through holes 20, 21, slots 50 are provided in the heat sink 4, and the adhesive may be placed in the slots 50 and cured as described above with respect to other examples.

Figure 4:
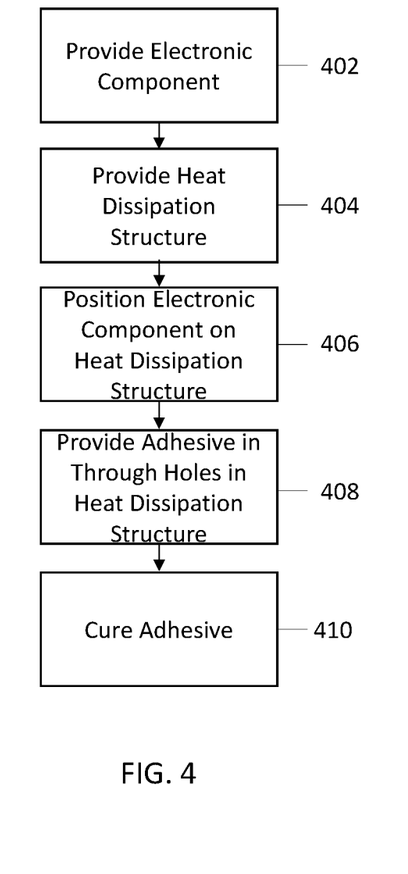
FIG. 4 is flow diagram of an example method of manufacturing an electronic device, such as the electronic device of FIG. 2A or 3A.

FIG. 4 is flow diagram of an example method of manufacturing an electronic device, such as the electronic device of FIG. 2A or 3A. In the example illustrated in FIG. 4, the method includes providing an electronic component (402). At least one heat dissipation structure may be provided (404). The at least one heat dissipation structure may include one or more through holes. The electronic component may be positioned on the at least one heat dissipation structure (406). The electronic component may be positioned over the one or more through holes in the at least one heat dissipation structure. An adhesive may be provided in the one or more through holes (408). The adhesive in the through holes may be in contact with the electronic component. The adhesive may be cured (410).

In some embodiments, the heat dissipation structure includes a slot, and the electronic device is placed at least partially in the slot. In some embodiments, the contact surface of the electronic device may be roughened for contact with the adhesive. In some embodiments, the electronic component may include pins, the pins may be positioned in the through holes in the at least one heat dissipation structure. In some embodiments, at least one light emitting element may be thermally coupled to the heat dissipation structure, and the at least one lighting element may be electrically coupled to the electronic component. In some embodiments, the electrically coupling may include providing at least one of wire bonds or ribbon bonds between the light emitting element and the electronic component.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. An electronic device comprising:
 a heat dissipation structure comprising a first heat dissipation portion and a second heat dissipation portion, the first heat dissipation portion comprising one or more openings, and the second heat dissipation portion comprising a mounting region on a top surface of the second heat dissipation portion that is configured to receive at least one light-emitting diode (LED);
 a circuit board having a top surface on at least a portion of a bottom surface of the first heat dissipation portion and under the one or more openings, wherein a side surface of the circuit board is in contact with a side surface of the second heat dissipation portion of the heat dissipation structure; and
 an adhesion material in the one or more openings that mechanically couples the top surface of the circuit board to the bottom surface of the first heat dissipation portion of the heat dissipation structure.

2. The electronic device of claim 1, wherein the one or more openings are through holes.

3. The electronic device of claim 2, wherein the one or more through holes are at least one of round or longitudinal.

4. The electronic device of claim 1, wherein the one or more openings are slots.

5. The electronic device of claim 1, wherein the adhesion material is one of a light curing type, a heat curing type, a condensation curing or a reaction curing type.

6. The electronic device of claim 1, wherein the circuit board further comprises electrical contacts for the at least one LED on a region of the circuit board adjacent the second heat dissipation portion.

7. The electronic device of claim 1, further comprising a contact area that comprises adhesion promotors on the top surface of the printed circuit board.

8. The electronic device of claim 7, wherein the adhesion promotors comprise at least one of a roughened surface or pins that extend into the one or more openings.

9. The electronic device according to claim 1, wherein the bottom surface of the first heat dissipation portion of the heat dissipation structure is in direct contact with the top surface of the printed circuit board.

10. The electronic device according to claim 1, wherein the heat dissipation structure comprises a heat sink or a heat spreader.

11. A light emitting device comprising:
a heat dissipation structure comprising a first heat dissipation portion and a second heat dissipation portion, the first heat dissipation portion comprising one or more openings, and the second heat dissipation portion comprising a mounting region on a top surface of the second heat dissipation portion;
a circuit board having a top surface on at least a portion of a bottom surface of the first heat dissipation portion and under the one or more openings, wherein a side surface of the circuit board is in contact with a side surface of the second heat dissipation portion of the heat dissipation structure;
an adhesion material in the one or more openings that mechanically couples the top surface of the circuit board to the bottom surface of the first heat dissipation portion of the heat dissipation structure; and
at least one light emitting element thermally coupled to the mounting region of the heat dissipation structure.

12. The light emitting device of claim 11, wherein the light emitting element is electrically coupled to the circuit board.

13. The light emitting device of claim 11, wherein the light emitting element is electrically coupled to the circuit board by at least one of wire bonds or ribbon bonds.

14. The light emitting device according to claim 11, wherein the at least one light emitting element is at least one light emitting diode (LED).

15. A method of manufacturing an electronic device comprising:
providing a circuit board;
providing at least one heat dissipation structure comprising a first heat dissipation portion and a second heat dissipation portion, the first heat dissipation portion comprising one or more openings, and the second heat dissipation portion comprising a mounting region on a top surface of the second heat dissipation portion that is configured to receive at least one light-emitting diode (LED);
positioning the circuit board with a top surface of the circuit board on at least a bottom surface of the first heat dissipation portion and under the one or more openings and with a side surface of the circuit board in contact with a side surface of the second heat dissipation portion of the heat dissipation structure;
providing an adhesive in the one or more through openings and in contact with the electronic component; and
curing the adhesive.

16. The method according to claim 15, wherein the at least one heat dissipation structure further comprises a slot, and the method further comprises positioning the electronic device at least partly in the slot.

17. The method according to claim 15, further comprising roughening a contact surface of the printed circuit board for contact with the adhesive.

18. The method according to claim 15, wherein the circuit board further comprises pins, and the method further comprises positioning the pins in the openings.

19. The method according to claim 16, further comprising:
thermally coupling at least one light emitting element to the mounting region of the heat dissipation structure; and
electrically coupling the at least one light emitting element to the circuit board.

20. The method according to claim 19, wherein the electrically coupling the at least one light emitting element to the circuit board comprises providing at least one of wire bonds or ribbon bonds between the light emitting element and the circuit board.

* * * * *